US006894425B1

(12) United States Patent
Solomon et al.

(10) Patent No.: US 6,894,425 B1
(45) Date of Patent: May 17, 2005

(54) TWO-DIMENSIONAL ULTRASOUND PHASED ARRAY TRANSDUCER

(75) Inventors: Rodney J Solomon, Andover, MA (US); Walter Patrick Kelly, Jr., Dracut, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/283,269

(22) Filed: Mar. 31, 1999

(51) Int. Cl.[7] ................................................ H01L 41/08
(52) U.S. Cl. ....................................................... 310/334
(58) Field of Search ................................ 310/334, 335, 310/336

(56) References Cited

U.S. PATENT DOCUMENTS

| | | | | |
|---|---|---|---|---|
| 4,277,712 A | | 7/1981 | Hanafy | 310/334 |
| 4,686,408 A | * | 8/1987 | Ishiyama | 310/334 |
| 4,773,140 A | * | 9/1988 | McAusland | 29/25.35 |
| 5,027,820 A | | 7/1991 | Pesque | 128/660.07 |
| 5,045,746 A | * | 9/1991 | Wersing et al. | 310/334 |
| 5,229,933 A | | 7/1993 | Larson, III | 364/413.25 |
| 5,267,221 A | | 11/1993 | Miller et al. | 367/140 |
| 5,311,095 A | * | 5/1994 | Smith et al. | 310/334 |
| 5,329,496 A | * | 7/1994 | Smith | 367/140 |
| 5,329,498 A | | 7/1994 | Greenstein | 367/155 |
| 5,435,313 A | | 7/1995 | Noda et al. | 128/662.03 |
| 5,460,181 A | | 10/1995 | Seyed-Bolorforosh | 128/661.01 |
| 5,462,057 A | | 10/1995 | Hunt et al. | |
| 5,573,001 A | | 11/1996 | Petrofsky et al. | 128/661.01 |
| 5,575,290 A | | 11/1996 | Teo et al. | 128/661.1 |
| 5,590,658 A | | 1/1997 | Chiange et al. | 128/661.01 |
| 5,622,177 A | | 4/1997 | Breimesser et al. | 128/662.06 |
| 5,655,536 A | | 8/1997 | Takamizawa | 128/661.01 |
| 5,671,746 A | | 9/1997 | Dreschel et al. | 128/661.01 |

(Continued)

OTHER PUBLICATIONS

T. Ota, "Accuracy of Left Ventricular Stroke Volume Measurement Using Real–Time, Three Dimensional Echocardiography Flow Probe in Vivo", 70th Scientific Session Amer. Heart Assn. Meeting, Nov. 11, 1997.

Goldberg, Ri.L. et al, "Multilayer Piezoelectric Ceramics for Two–Dimensional Array Transducers", IEEE Transactions on Ultrasonics, Ferroelectrics & Freq. Control, vol. 41, No. 5, Sep. 1994, pp. 761–771.

Takahiro Ota et al, Novel Determination of Left Ventricular, vol. by Tracing Arbitrary Planes Using Real–Time, 3D Echocardiography: In Vitro and In Vivo Validation, 709th Scientific Session American Heart Assn. Meeting, Nov. 11, 1997, p. 1832.

(Continued)

*Primary Examiner*—Nestor Ramirez
*Assistant Examiner*—Peter Medley

(57) ABSTRACT

A two-dimensional ultrasound phased array transducer includes an acoustic backing, a first circuit, which may be a flexible circuit disposed over the acoustic backing or a ground plane, an acoustically absorptive interface layer disposed over the flexible circuit, and a piezoelectric layer disposed over the interface layer. A matching layer may be disposed over the piezoelectric layer, and a second circuit, which may be a ground plane or a flexible circuit, may be disposed over the matching layer. The piezoelectric layer and the matching layer are diced by forming kerfs extending through these layers and at least partially into the interface layer. Extending the kerfs into the interface layer reduces cross-talk between elements, electrically isolates the elements, and facilitates manufacturing by reducing the precision required in controlling the depth of the cut. The acoustically absorptive interface layer may have acoustic properties similar to the backing material and may be formed of the same material as the backing material. Electrical interconnection between the piezoelectric elements and the first circuit is provided through the interface layer. The electrical connection may be formed by laser drilled vias in the interface layer, coated with gold or another suitable material.

15 Claims, 11 Drawing Sheets

U.S. PATENT DOCUMENTS

| | | | | |
|---|---|---|---|---|
| 5,690,114 | A | 11/1997 | Chiange et al. | 128/661.01 |
| 5,732,706 | A | 3/1998 | White et al. | 128/661.01 |
| 5,744,898 | A | 4/1998 | Smith et al. | 310/334 |
| 5,797,845 | A | 8/1998 | Barabash et al. | 600/443 |

OTHER PUBLICATIONS

Fleishman, C. E. et al, "Evaluation of Atrioventricular Valve Abnormalities Using Real–Time Three Dimensional Echocardiography", 70th Scientific Session Amer. Heart Assn. Meeting, Nov. 11, 1997, p. 1045.

Ming Shu et al, "Tricuspid Velocity Profiles Reflect Right Ventricular Diastolic Wall Motion Abnormalities: Real–Time 3D Echocardiography and Computational Fluid Dynamics", 70th Scientific Session Amer. Heart Assn. Meeting, Nov. 11, 1997, p. 2990.

Takahiro S. et al, "Application of a New Real–Time Three–Dimensional Method for Evaluating Right Ventricular Stroke Volume", 70th Scientific Session Amer. Heart Assn. Meeting, Nov. 11, 1997, p. 1830.

S. Smith et al, "Two–Dimensional Array Transducers Using Hybrid Connection Technology", IEEE, Oct. 1992, pp. 555–558, vol. 1.

L. Daane et al, "A demountable Interconnect System for a 50×50 Ultrasonic Imaging Transducer Array", IEEE, Sep. 1997, pp. 978–982.

S. Smith et al, "2–D Array Transducers for Medical Ultrasound at Duke University: 1966", ISAF '96 Proceedings of the 10th IEEE Int'l. Symposium on Appl. of Ferroelectrics, vol. 1, Aug. 1996, pp. 5–11.

R. Goldberg et al, "Multilayer 2–D Array Transducers with Integrated Circuit Transmitters and Receivers: A Feasibility Study", IEEE, 1994 Ultrasonics Symposium, pp. 1511–1514.

A. L. Robinson et al, "Applications of Microelectronics and Microfabrication to Ultrasound Imaging Systems", IEEE 1992, Ultrasonics Symposium Proceedings, vol. 1, pp. 681–691.

* cited by examiner

TWO-DIMENSIONAL ULTRASOUND PHASED ARRAY TRANSDUCER

BACKGROUND OF THE INVENTION

1. Field of the Invention

The present invention relates generally to two-dimensional phased-array transducers and, more particularly, to two-dimensional ultrasound phased array transducers.

2. Related Art

Diagnostic ultrasound is used in many different fields of technology as a non-invasive method of determining the internal structure of an object. Diagnostic ultrasound, for example, is used in various medical specialties, such as obstetrics, cardiology and radiology, and may be used in other diverse fields, such as in metallurgy to determine the patency of a weld, etc.

Medical ultrasound scanners typically use a Nx1 linear array of transducer elements. Ultrasound energy transmitted and received by the array may be electronically steered and focused using known phased array techniques. One conventional transducer is illustrated in FIGS. 1 and 2. As shown in FIG. 1, a typical transducer array 1 is formed on an acoustic backing 10 that serves to isolate acoustically individual transducer elements 5. A piezoelectric layer 16 is formed on the acoustic backing 10. Typically the piezoelectric layer 16 is formed of a material such as lead zirconate titanate (PZT). An electrically conductive acoustic matching layer 18 is formed on top of the piezoelectric layer 16, and a ground plane 20 is formed on top of the matching layer 18. Interconnect wires 26 along one side of the acoustic backing 10 connect the individual transducer elements 5 to processing electronics. After the laminate structure is formed but before the ground plane 20 is formed, kerfs 40 are formed through the laminate into the backing 10, between interconnect wires 26, to separate the laminate structure into a plurality of parallel ultrasound transducer elements 5. Typically, ultrasound transducer elements are approximately 0.2 mm wide and 10 mm long. The ultrasound transducer array 1 is typically disposed in a user manipulable probe having a handle for grasping by the user. The probe is connected to the electronics portion of an ultrasound imaging system via a cable.

Linear arrays can focus an ultrasound beam in two dimensions using known phased array techniques. Thus a linear array is able to acquire data representing a two-dimensional slice through the object to be analyzed. To expand the capabilities of diagnostic ultrasound, experimentation has been conducted using two-dimensional ultrasound arrays. Using phased array techniques, two-dimensional ultrasound arrays have the potential of being able to compensate for tissue inhomogeneities or aberrations, to enable the beam to be steered in three dimensions and to thereby acquire three-dimensional images, and may be useful for calculating volumes within the object to be analyzed.

Unfortunately, fabrication of a two-dimensional ultrasound phased array transducer using the above-described manufacturing techniques is not trivial. It is necessary to connect each individual element of a two-dimensional phased array ultrasound transducer to associated circuitry. Since fabrication of the individual two-dimensional ultrasound phased array transducer elements involves cutting a kerf through the piezoelectric layer and into the backing layer in "X" and "Y" directions, it is not possible to simply form traces on the backing layer, as was done for one-dimensional arrays, since the traces would be severed during the kerf formation process (also called dicing). In addition, the extremely small size of the transducer elements complicates the manufacturing process.

Accordingly, it would be advantageous to provide a two-dimensional phased array ultrasound transducer that is simple to manufacture, while allowing the elements of the array to be connected individually to associated processing circuitry. It would also be advantageous to provide a simple manufacturing process for producing a two-dimensional phased array transducer.

SUMMARY OF THE INVENTION

The present invention relates to two-dimensional phased array ultrasound transducers that are simple to manufacture, while allowing the elements of the arrays to be connected individually to associated circuitry. The present invention also relates to a method of manufacturing two-dimensional phased array transducers.

In one embodiment, a two-dimensional ultrasound transducer includes an acoustic backing, a flexible circuit disposed over the acoustic backing, an acoustically absorptive interface layer disposed over the flexible circuit, and a piezoelectric layer disposed over the interface layer and electrically connected to the flexible circuit through the interface layer. A matching layer may be disposed over the piezoelectric layer, and a ground plane may be disposed over the matching layer. The piezoelectric layer and the matching layer are diced by forming kerfs extending through these layers and at least partially into the interface layer. Extending the kerfs into the interface layer reduces cross-talk between elements, electrically isolates the elements, and facilitates manufacturing by reducing the required precision in the depth of the kerfs, without cutting the flexible circuit.

The acoustically absorptive interface layer may have acoustic properties similar to the backing material and may be formed from the same material as the backing material. The piezoelectric elements and the flexible circuit are electrically interconnected through the interface layer. In one embodiment, this electrical connection may comprise laser drilled vias in the interface layer coated with gold or another suitable material, or filled with an electrically conductive substance such as electrically conductive epoxy.

The array may be fabricated by providing a backing layer, disposing a flexible circuit over the backing layer, disposing an acoustically absorptive interface layer over the flexible circuit, disposing a piezoelectric layer over the acoustically absorptive interface layer, and dicing the piezoelectric layer to form kerfs extending through the piezoelectric layer and into the acoustically absorptive interface layer.

In another embodiment, the flexible circuit layer may be formed over the piezoelectric layer.

In this embodiment, the ground plane is disposed below the interface layer, and the flexible circuit is disposed on the piezoelectric layer after dicing of the piezoelectric layer.

BRIEF DESCRIPTION OF THE DRAWINGS

The above and further advantages of this invention may be better understood by referring to the following description when taken in conjunction with the accompanying drawings, in which.

DETAILED DESCRIPTION

A two-dimensional ultrasound phased array transducer in accordance with the invention provides excellent acoustic characteristics over a wide range of frequencies, yet is relatively simple to manufacture using standard manufacturing techniques. In one embodiment, an interface layer with similar acoustic characteristics to an acoustic backing layer is provided between a flexible circuit and a piezoelectric layer. When the array is diced, the dicing can extend into the interface layer to acoustically isolate array elements, thus reducing the precision required during the dicing process. An interface layer having sufficient thickness prevents dicing from severing traces on the flexible circuit and permits individual connection to elements of the array.

Figure 1:
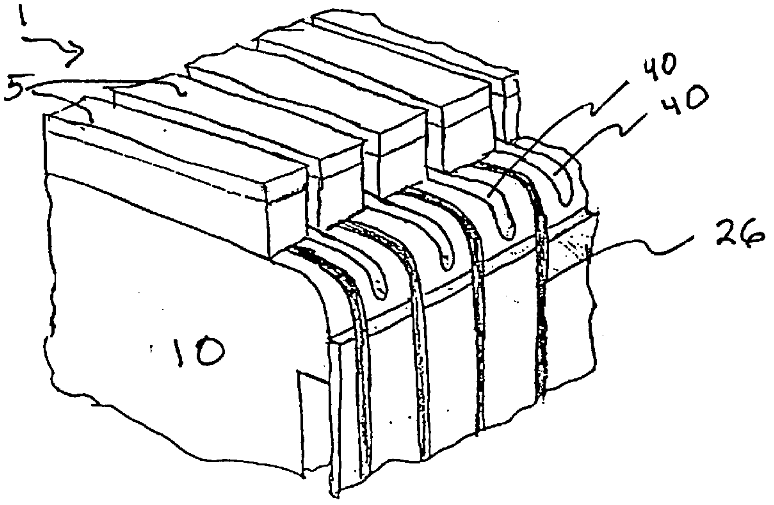
Figure 1 (PRIOR ART)
FIG. 1 is a partial perspective view illustrating the structure of a conventional linear array transducer.
Figure 2:
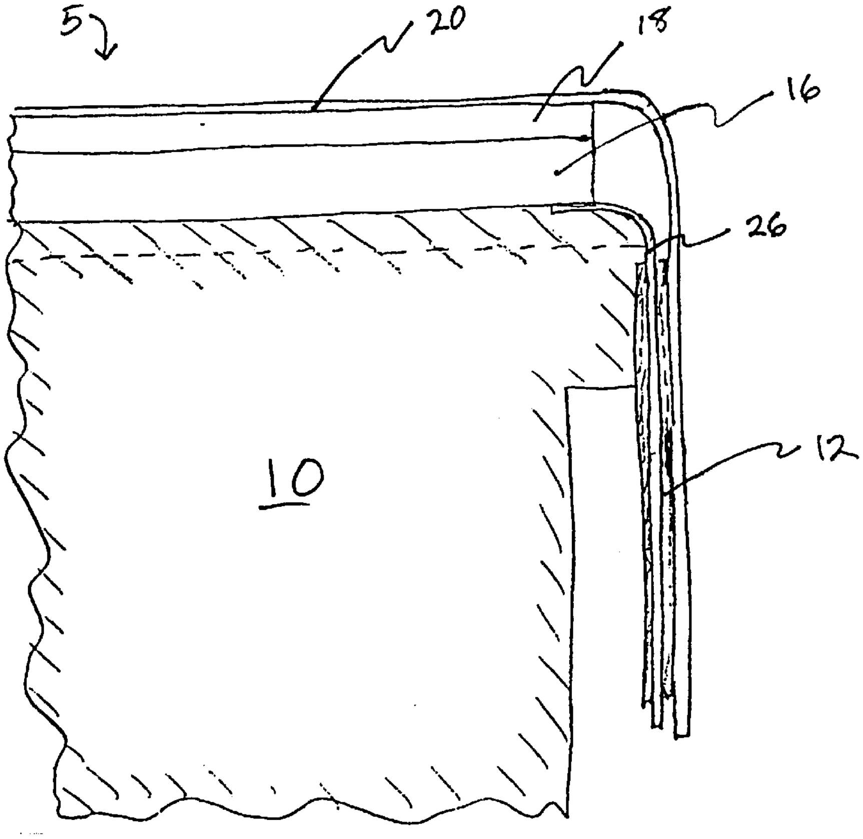
Figure 2 (PRIOR ART)
FIG. 2 is a partial cross-sectional view of the conventional linear array transducer element of FIG. 1.
Figure 3:
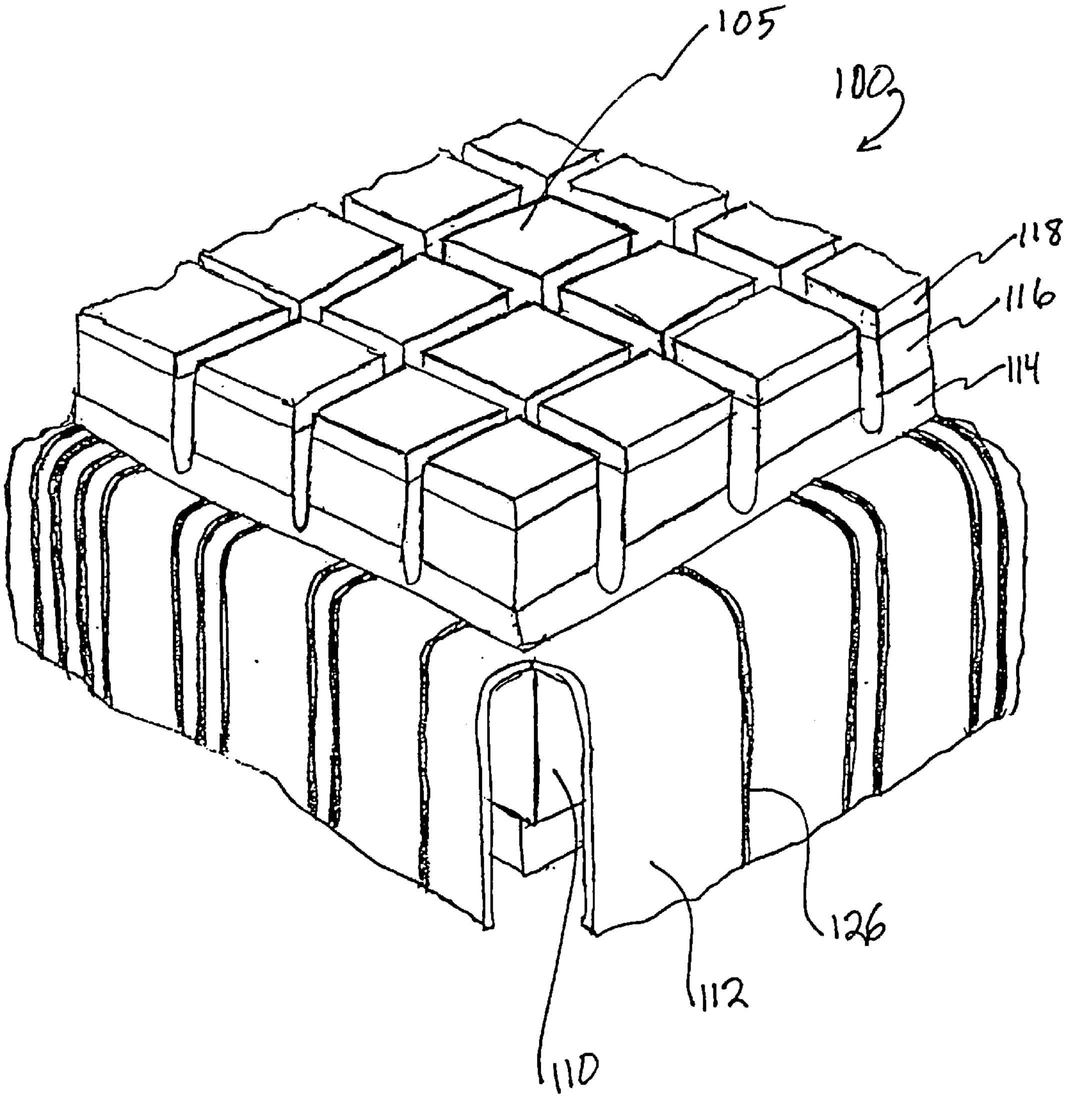
FIG. 3 is an enlarged partial perspective view of a two-dimensional ultrasound phased array transducer according to one embodiment of the invention.

As shown in FIG. 3, a two-dimensional ultrasound phased array transducer 100 includes a number of individual elements 105 on an acoustic backing 110. A flexible circuit 112 is disposed on the acoustic backing 110 and provides electrical interconnection between processing circuitry (illustrated in FIG. 4) and individual elements 105 of the two-dimensional ultrasound phased array transducer 100. An interface layer 114 is disposed over the flexible circuit 112, and a piezoelectric layer 116 and an acoustic matching layer 118 are disposed over the interface layer. During dicing, acoustic matching layer 118 and piezoelectric layer 116 are cut into individual elements. After dicing, a common ground layer (not shown) may be disposed over the matching layer 118. Elements 105 are individually connected to the flexible circuit 112 through the interface layer 114. The interface layer 114 in this embodiment protects the flexible circuit 112 against damage during dicing and, since it is made of material having properties similar to the backing material, attenuates sound waves during operation to limit cross-talk between elements.

Figure 4:
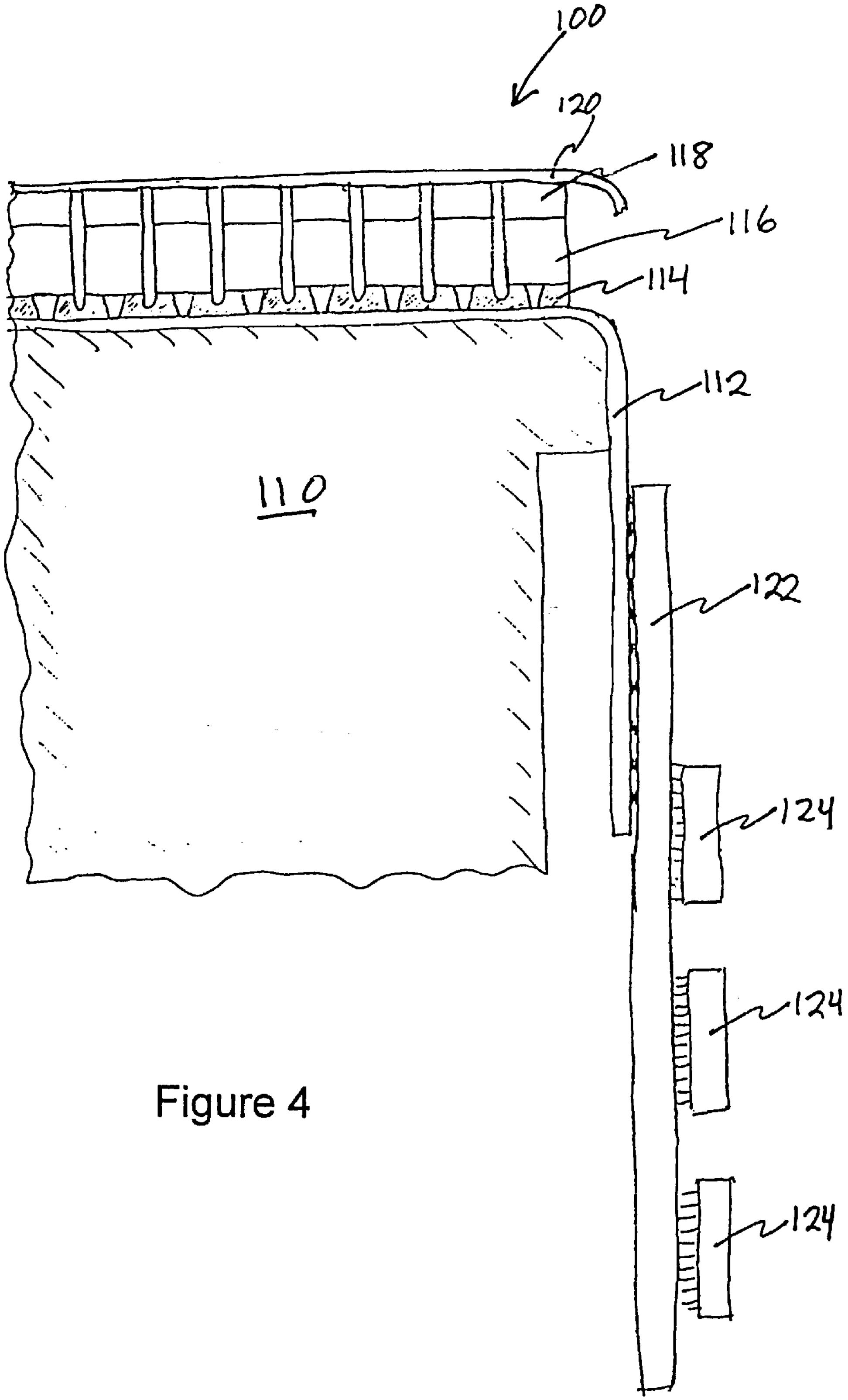
FIG. 4 is an enlarged partial cross-sectional view of the two-dimensional ultrasound phased array transducer of FIG. 3.
Figure 8:
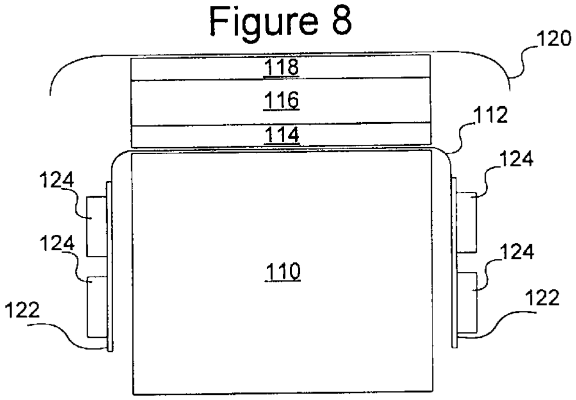
FIG. 8 is a schematic side view of the two-dimensional ultrasound phased array transducer, illustrating placement of the flexible circuit between the interface layer and the backing layer.
Figure 9:
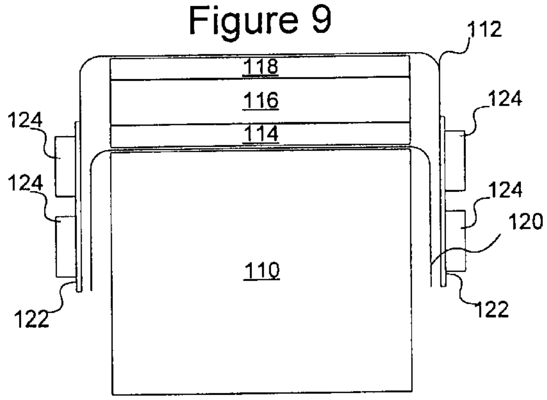
FIG. 9 is a schematic side view of the two-dimensional ultrasound phased array transducer, illustrating placement of the ground layer between the interface layer and the backing layer, and illustrating placement of the flexible circuit above the matching layer.

As shown in FIGS. 4, 8 and 9, one or more printed circuit (PC) boards 122 may be attached at one or more places to the flexible circuit 112. Preferably, one or more PC boards 122 are connected to the flexible circuit around the periphery of the two-dimensional ultrasound phased array transducer 100. Integrated circuits 124 containing transmit and/or receive circuitry are disposed on the PC board 122.

Figure 5:
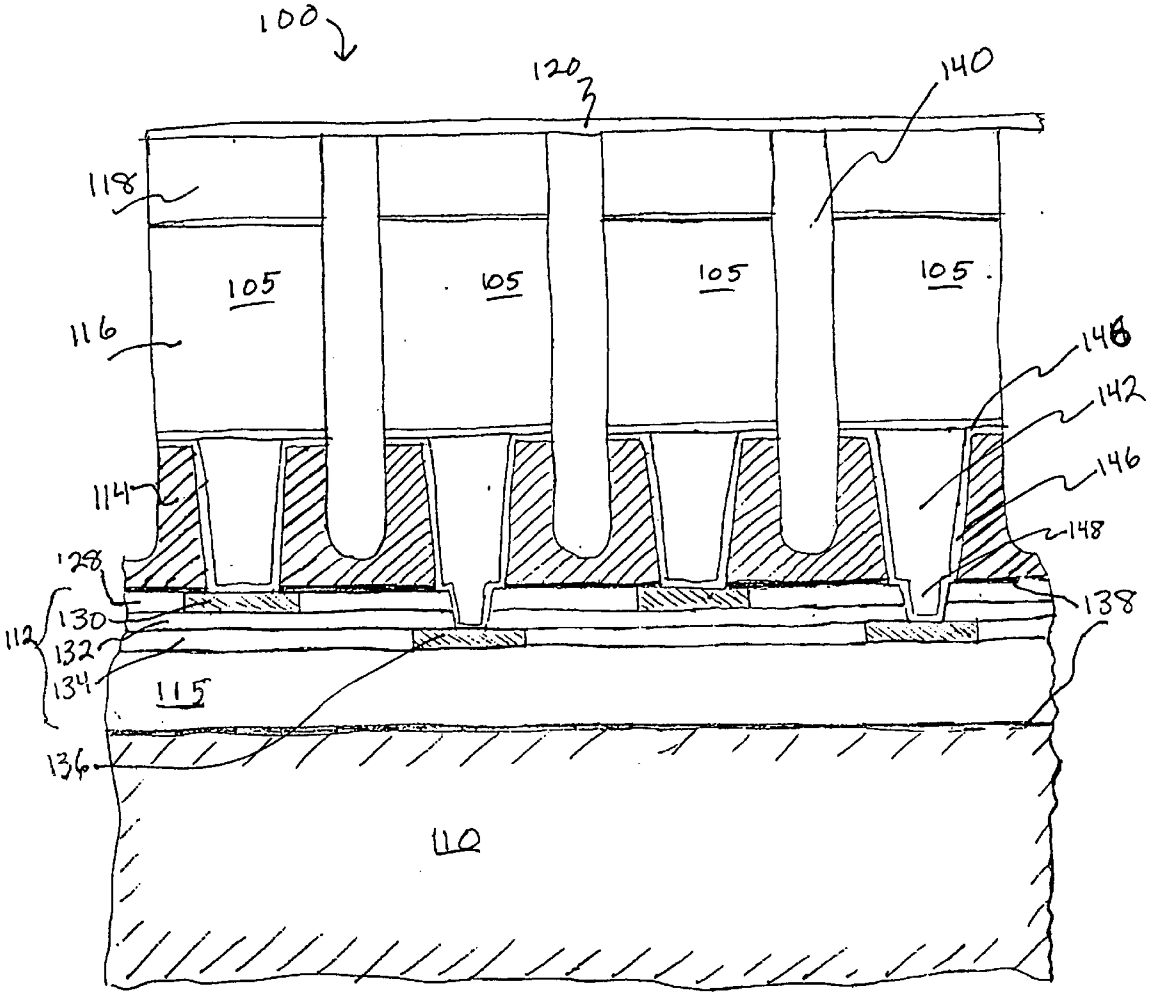
FIG. 5 is an enlarged partial cross-sectional view of the two-dimensional ultrasound phased array transducer of FIG. 4.

FIG. 5 illustrates, in greater detail, the structure of the two-dimensional ultrasound phased array transducer 100. Acoustic backing 110 may be an epoxy or any other acoustically absorptive backing material. The backing absorbs ultrasonic energy generated by individual elements 105 of the two-dimensional ultrasound phased array transducer 100 and thereby limits cross-talk between individual elements.

A circuit, such as flexible circuit 112, is affixed to the acoustic backing 110. Preferably, an adhesive 138 is used to bond the flexible circuit 112 to the acoustic backing 110. Epoxy, cyanoacrylate, or any other adhesive capable of bonding the flexible circuit 112 to the acoustic backing 110, may be used for this purpose. The flexible circuit 112 has a flexible base layer 115 and one or more layers of conductive traces formed on its upper and/or lower surfaces. In the illustrated embodiment, the flexible circuit 112 has a lower trace layer 134 carrying lower traces 136, and an upper trace layer 128 carrying upper traces 130. A dielectric layer 132 is disposed between the lower trace layer 134 and the upper trace layer 128 to isolate electrically traces of one layer from traces of the other layer. Any suitable dielectric capable of electrically isolating the traces may be used for this purpose. Additional dielectric and/or trace layers may be included in the flexible circuit layer.

Vias 148 are formed in areas of the upper trace layer 128 and dielectric layer 132 to expose portions of the lower traces 136 in lower trace layer 134. To avoid the possibility of interconnecting lower traces 136 and upper traces 130, the vias 148 are preferably formed in areas of the upper trace layer 128 unoccupied by upper traces 130.

Interface layer 114 is bonded to the top surface of the upper trace layer 128 using an appropriate adhesive. Suitable adhesives include epoxy, cyanoacrylate and other adhesives capable of bonding the interface layer 114 to the upper trace layer 128. The interface layer 114 is formed of a material that absorbs sound waves generated by the piezoelectric layer 116. Preferably, the interface layer is formed of material with acoustic properties similar to those of the backing 110. Optionally, the interface layer may be made of the same material as the backing 110.

The piezoelectric elements 105 are connected to respective traces on flexible circuit 112 with an anisotropically conductive interface structure which has low lateral conductivity (in the plane of interface layer 114) and has high electrical conductivity (perpendicular to interface layer 114) in selected areas. Numerous techniques may be used for fabricating structures of this type. One exemplary technique is to drill vias 142 in the interface layer 114, which has low electrical conductivity, using a laser or other appropriate device and then form a conductive channel within each laser drilled via. An electrically conductive channel may be formed by layering, depositing, sputtering or otherwise coating a conductive substance, such as gold, onto the interface layer 114 and in the laser drilled vias 142 to form an electrically conductive layer 146. Alternatively, the vias 142 may be filled with an electrically conductive substance, such as electrically conductive epoxy, that also may be used to adhere the piezoelectric layer 116 to the interface layer 114.

In this exemplary technique, the laser drilled vias 142 may be formed in the interface layer 114 prior to or after mounting the interface layer 114 on the flexible circuit 112. The vias 142 are aligned with vias 148 (FIG. 5) and with pads 149 (illustrated in FIG. 6) on flexible circuit 112. Alignment of the laser to drill the holes is well within the knowledge of a person of skill in the art. After the holes are drilled, the electrically conductive layer 146 is formed by coating the top surface of the interface layer 114, including the surfaces of the laser drilled vias 142, with an electrically conductive material such as gold. Sputtering or other known techniques may be used for this purpose. Alternatively, electrically conductive adhesive may be used to fill the vias. In this way, an anisotropically conductive interface structure including interface layer 114, vias 142 and conductive layer 146 establishes an electrical interconnection between the pads 149 on traces 130, 136 on the flexible circuit 112 and the top surface of the interface layer 114.

Piezoelectric layer 116 coated on its lower and upper surfaces with gold or other conductive material is disposed over the conductive layer 146 on the top surface of the interface layer 114. Preferably, the piezoelectric layer 116 is formed of PZT. The piezoelectric layer may be disposed over interface layer 114 using known techniques and may be adhered to the interface layer using known adhesives, such as epoxy. If an electrically non-conductive adhesive is used, the piezoelectric layer should be firmly pressed into the interface layer to ensure a good electrical interconnection between the piezoelectric layer 116 and the electrically conductive interface layer 146. Sufficient adhesive is preferably provided to fill the laser drilled vias 142 to eliminate air pockets that could otherwise act as resonance chambers. If electrically conductive epoxy is used, it is unnecessary to coat the interface layer with conductive layer 146 prior to disposing the piezoelectric layer 116 over the interface layer 114, since the electrically conductive adhesive itself ensures adequate connection between the flexible circuit 112 and the piezoelectric layer 116. Exemplary techniques of this nature have been developed in connection with the fabrication of one-dimensional ultrasound transducer arrays and are well known in the art.

Acoustic energy generated by the piezoelectric layer 116 is absorbed by the acoustically absorptive interface layer 114 and the backing 110. By provision of an acoustically absorptive interface layer 114 which absorbs a relatively large spectrum of ultrasound frequencies, the acoustic array may operate over a broad band.

A matching layer 118 is formed over the piezoelectric layer 116 and functions to match the acoustic impedance of the two-dimensional ultrasound phased array transducer 110 to the acoustic impedance of the object being imaged. The provision of matching layers in ultrasound phased array transducers is well known in the art.

The matching layer 118 and the piezoelectric layer 116 are diced to form kerfs 140 which define a plurality of individual elements 105. In one embodiment, sixty five kerfs are cut in each direction to define a 64×64 array comprising 4096 individual elements. By way of example, the elements thus formed may be approximately 0.2 mm wide, 0.2 mm long, and 0.5 mm thick. The dimensions of the elements are related to the wavelength of the acoustic energy produced by the elements. Typically the kerfs are approximately 40 microns wide. Depending on the size of the array and the widths of the traces, this value may vary considerably.

Extending the kerfs 140 into the interface layer 114 during dicing has a number of important advantages. First, it reduces the amount of cross-talk between elements of the array. Second, because the depth of the kerf is not critical, dicing can be performed rapidly, without requiring high precision in the depth of the cuts during the dicing process. Third, by cutting into the interface layer, the electrically conductive layer 146 on the top surface of the interface layer is also cut, thereby electrically isolating the individual transducer elements. The interface layer 114 should be sufficiently thick to prevent the dicing process from severing traces on the flexible circuit 112. In a preferred embodiment, the interface layer 114 is approximately 0.5 mm thick.

A gold foil or other ground plane 120 may be formed on top of the matching layer after dicing. Because the ground plane 120 may be a very thin foil, little if any acoustic energy is transmitted between individual elements 105 through the ground plane 120. Likewise, the thin ground plane does not interfere significantly with transmission and reception of ultrasound energy.

Figure 6:
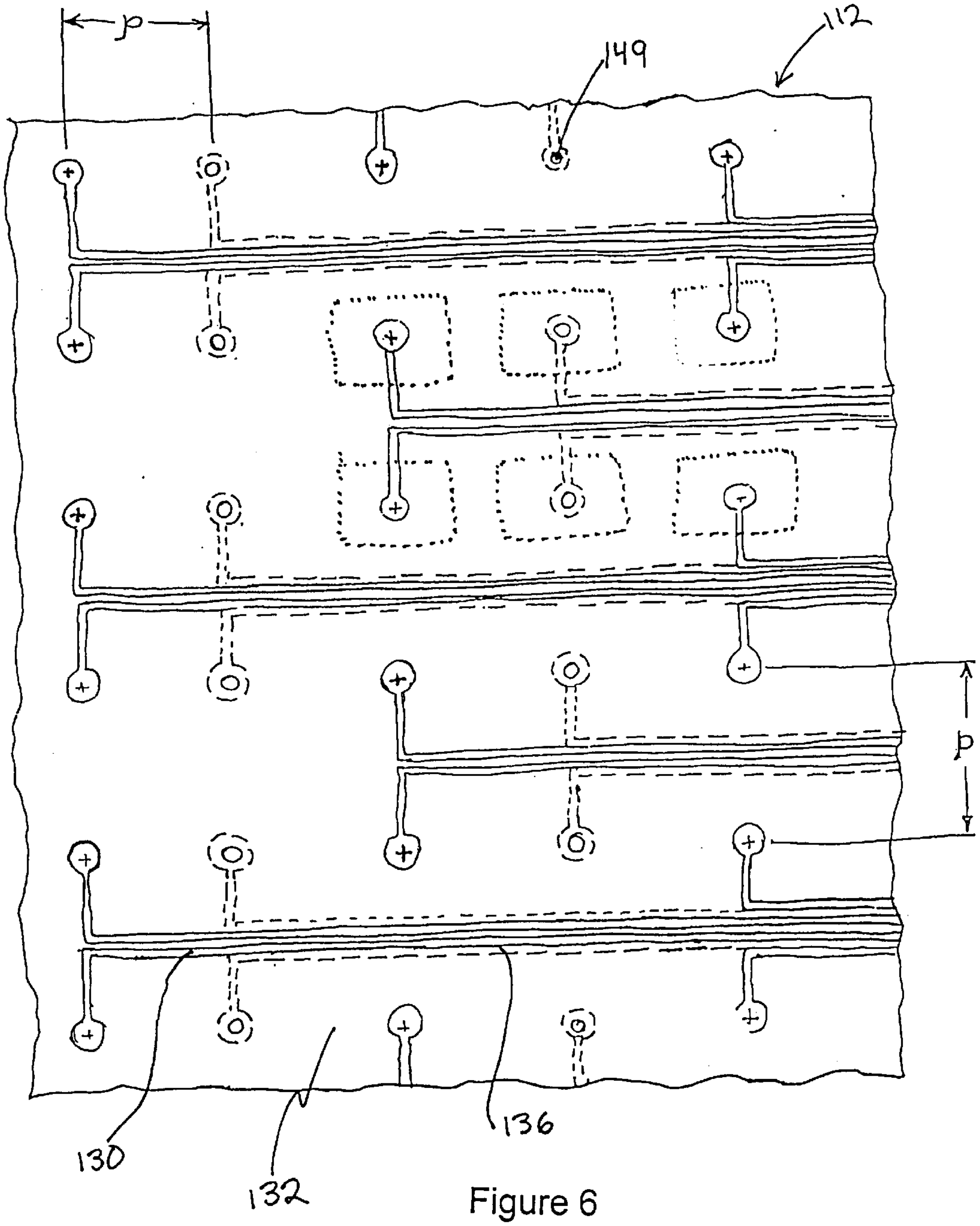
FIG. 6 is a top view of a portion of the flexible circuit used in connection with the embodiment of FIG. 3, illustrating trace patterns.

FIG. 6 illustrates an exemplary trace pattern on the flexible circuit 112, in which upper traces 130, on the upper trace layer, are illustrated as solid lines and lower traces 136, on the lower trace layer, are illustrated as dashed lines. The traces 130, 136 are connected to pads 149. Each pad 149 is located in an area underlying an individual transducer element 105 in the completed two-dimensional ultrasound phased array transducer 100. Pads 149 facilitate connection to the piezoelectric layer through the interface layer 114.

If the individual transducer elements 105 are formed in rows and columns, the minimum pitch of the individual elements 105 may be determined by multiplying the number of traces required to be formed between adjacent elements by the width of each trace. For example, the trace pattern for an array containing 64 by 64 discrete elements, may be designed such that a maximum of 32 traces is formed between pairs of adjacent pads 149. Thus, if traces have trace width of 10 microns, the minimum element-to-element pitch will be on the order of 320 microns. In this example, 10 micron traces are formed with 10 micron spacing between traces on two layers of the flexible circuit. The layers are staggered so that the traces are disposed on the flexible circuit in a non-overlapping manner to limit capacitive coupling between traces. The wiring of the flexible circuit is thus of sufficient density to allow all the conductors or traces from the elements to be accessed at the periphery of the array. Flexible circuits with sufficient trace densities are available from Dynamics Research Corp., Metrigraphics Division, of Wilmington, Mass.

Figure 10:
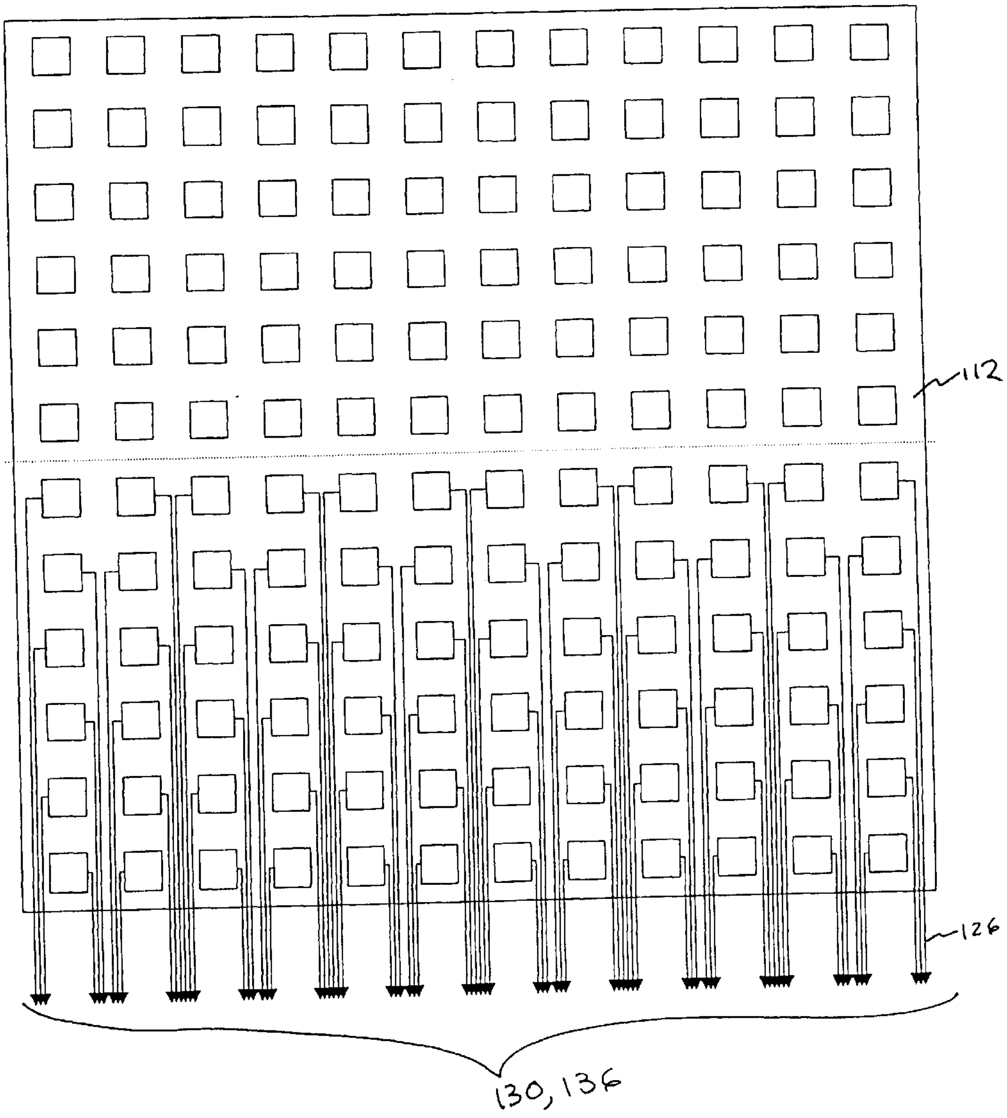
FIG. 10 is a schematic top view of the flexible circuit, illustrating traces of individual elements accessible from two sides of the two-dimensional ultrasound phased array transducer.
Figure 11:
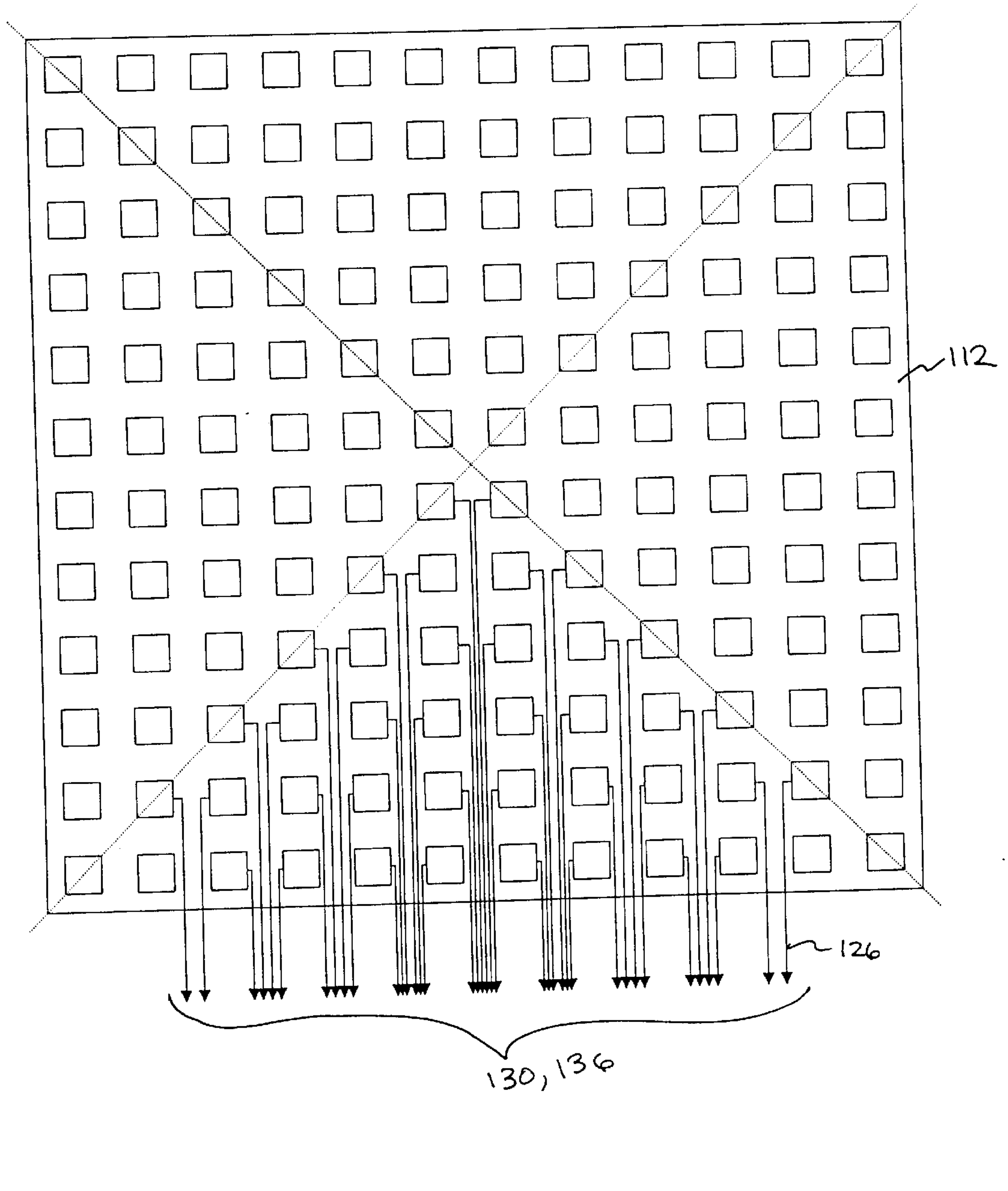
FIG. 11 is a schematic top view of the flexible circuit, illustrating traces of individual elements accessible from four sides of the two-dimensional ultrasound phased array transducer.

As shown in FIG. 10, traces 126 may be formed on the flexible circuit 112 to interconnect with ICs on PC boards connected to two opposite edges of the flexible circuit 112. Alternatively, as shown in FIG. 11, traces 126 on flexible circuit 112 may connect to PC boards mounted on all four edges of the flexible circuit 112. In both FIGS. 10 and 11, a portion of the traces has been illustrated. Trace patterns in each of the other non-illustrated sections (separated by dashed lines) may be identical.

Figure 7:
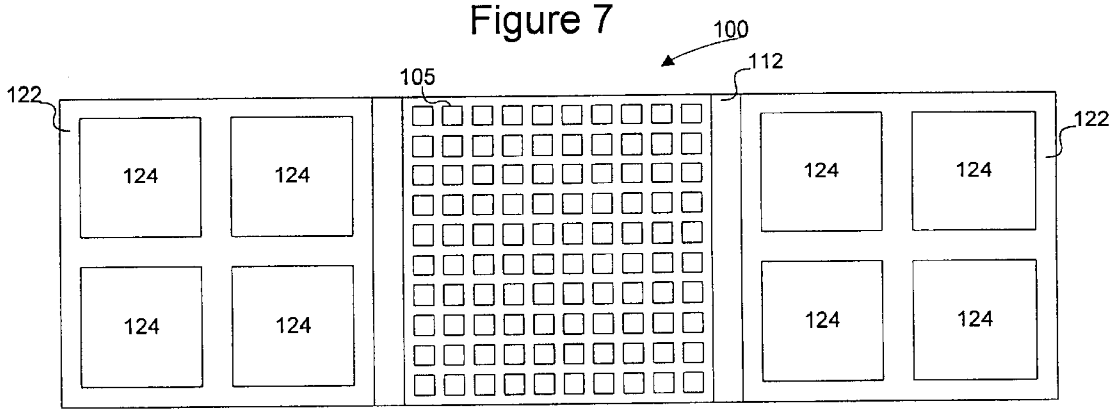
FIG. 7 is a schematic diagram of the transducer of FIG. 3 with the flexible circuit flexed outwardly, illustrating placement of components on PC boards connected to the flexible circuit.

A plan view of a flexible circuit with sides flexed outwardly is illustrated in FIG. 7. Individual elements 105 of the two-dimensional ultrasound phased array transducer 100 are connected to flexible circuit 112. In this embodiment, PC boards 122 carrying ICs 124 are attached to two edges of flexible circuit 112. The PC boards may be attached to any number of edges of the flexible circuit 112. Alternatively, the ICs can be attached directly to the flexible circuit 112. As illustrated in FIGS. 8 and 9, the flexible circuit 112 may be flexed along the sides of the array of individual elements. Optionally, the PC boards may be eliminated and a cable may be used to connect the traces of flex circuit 112 directly to the system electronics.

FIG. 8 illustrates the above-described embodiment wherein the flexible circuit 112 is disposed between the backing 110 and interface layer 114, and the ground plane is disposed above the matching layer 118. Other embodiments of the invention will now be described, with reference to FIGS. 9–14.

Figure 12:
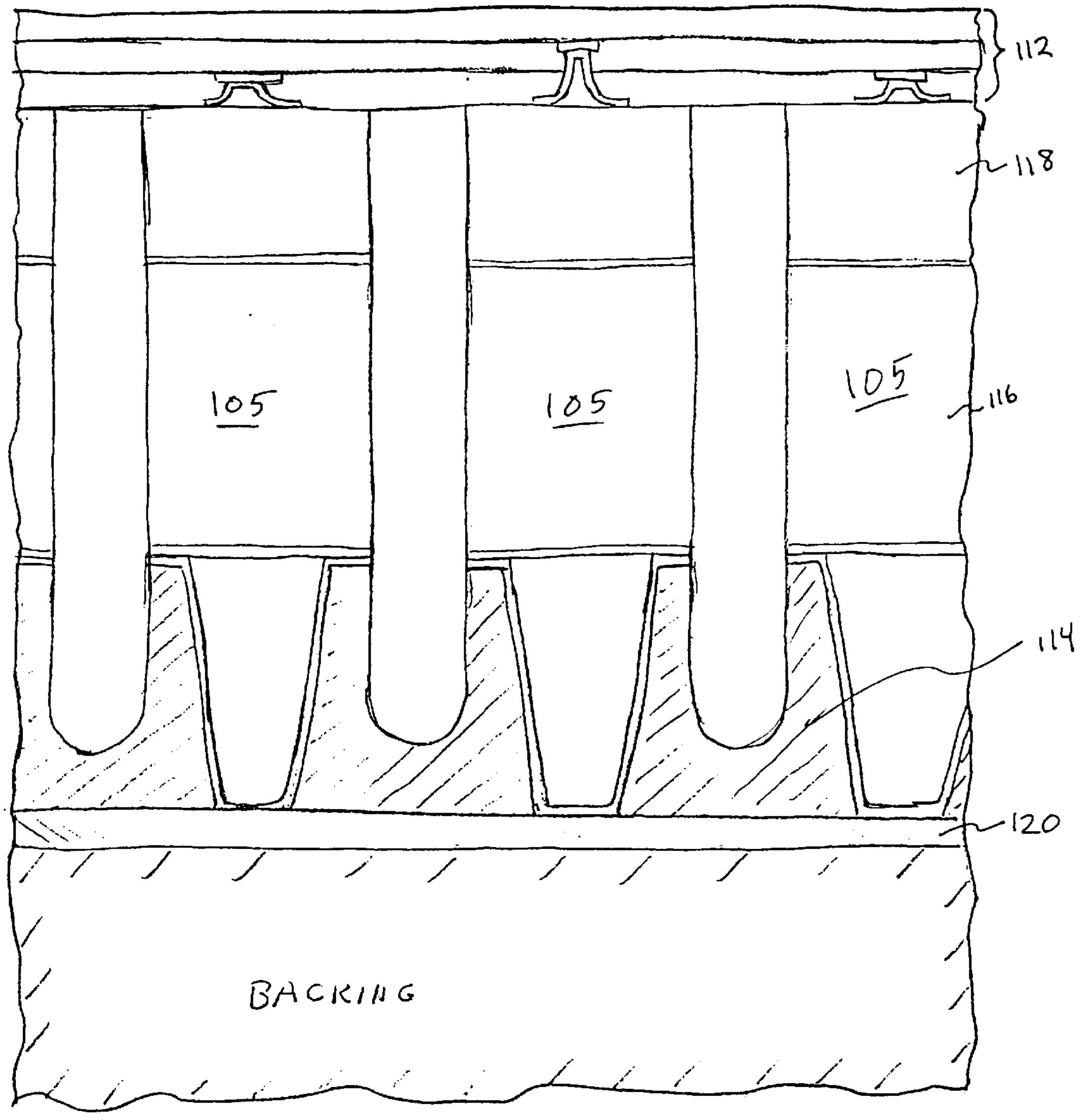
FIGS. 12–14 are enlarged partial cross-sectional views of two-dimensional ultrasound phased array transducers according to other embodiments of the invention.

As shown in FIGS. 9 and 12, the relative position of the ground plane 120 and flexible circuit 112 may be reversed, so that the ground plane 120 is disposed between the backing 110 and interface layer 114. In this situation, the interface structure shown in FIG. 5 is not required, since the interface layer 114 electrically interconnects the ground plane and the elements 105, and isolated connections are not required. Accordingly, although the interface structure shown in FIG. 5 and described above can be utilized, the interface layer 114 can optionally be electrically conductive. Also, when the interface layer 114 is electrically conductive there is no need to use a separate ground plane 120, since the electrically conductive interface layer 114 functions as the ground plane.

In other embodiments, the ground plane 120 or flexible circuit 112 may be disposed above the piezoelectric layer 116, but below the matching layer 118. These embodiments are illustrated in FIGS. 13 and 14, respectively.

Figure 13:
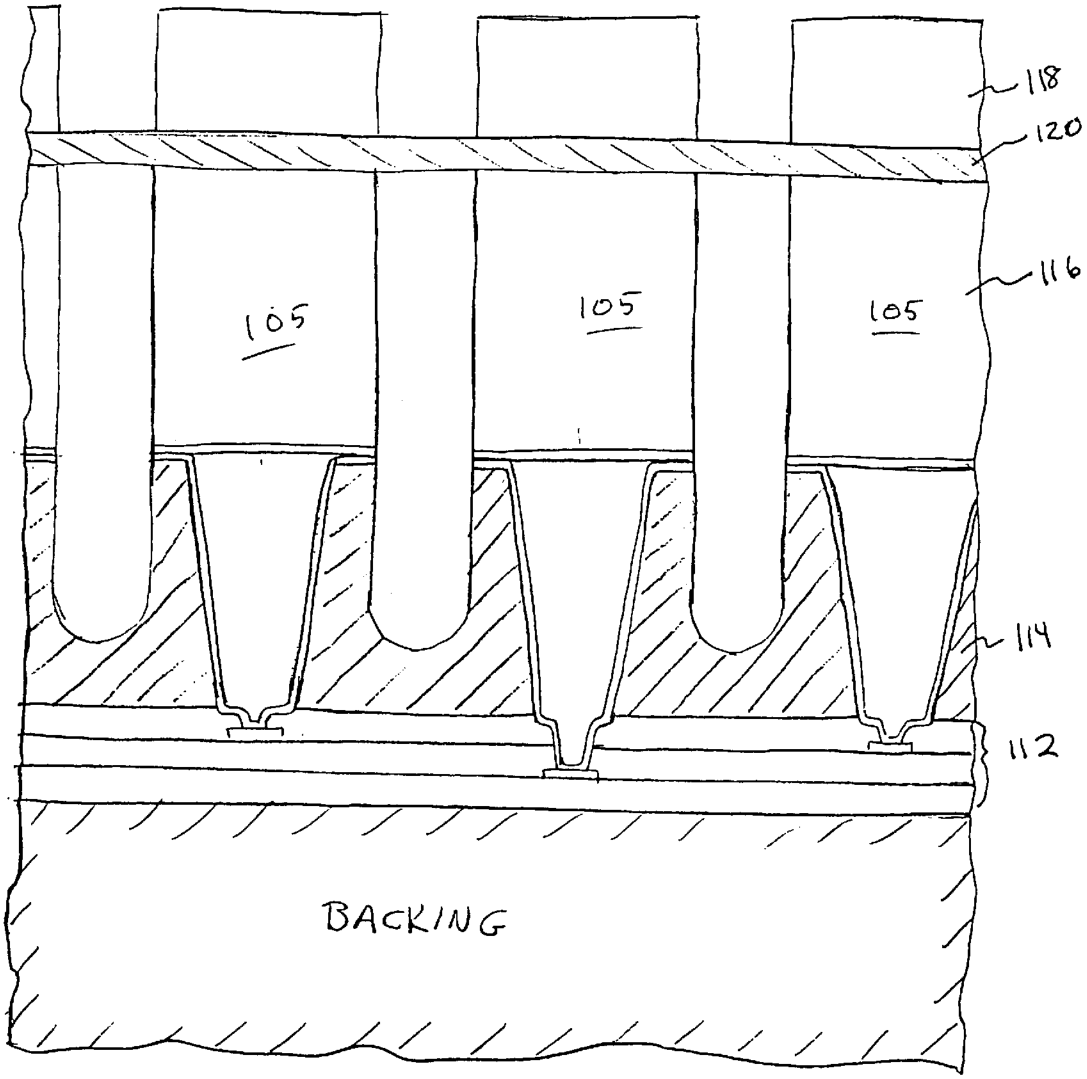

Specifically, in FIG. 13, backing 110, flexible circuit 112, interface layer 114 and piezoelectric layer 116 are all fabricated as described above with respect to FIGS. 3–8. In this embodiment, however, the piezoelectric layer 116 is diced prior to mounting the matching layer 118 on the piezoelectric layer. Dicing extends into the interface layer 114 as before. Then, the ground plane 120 is disposed over the diced piezoelectric layer 116.

A diced matching layer 118 is then positioned on the ground plane 120 and is aligned with the diced piezoelectric layer 116. One way to positioned a diced matching layer 118 over the ground plane is to partially dice a matching layer 118 layer before the matching layer is mounted on the ground plane 120. In this situation, the matching layer 118 should have a thickness greater than the desired thickness. This partially diced matching layer is then inverted and is placed on the ground plane 120, so that the diced side is in contact with the ground plane 120. The partially diced matching layer 118 is aligned with the diced piezoelectric layer 116 using known alignment techniques and is adhered to the ground plane 120 in the aligned condition. The matching layer 118 is then lapped in a lapping machine to remove the portion that is not diced. Providing the ground plane 120 between piezoelectric layer 116 and the matching layer 118 advantageously allows an electrically non-conductive matching layer to be used.

Figure 14:
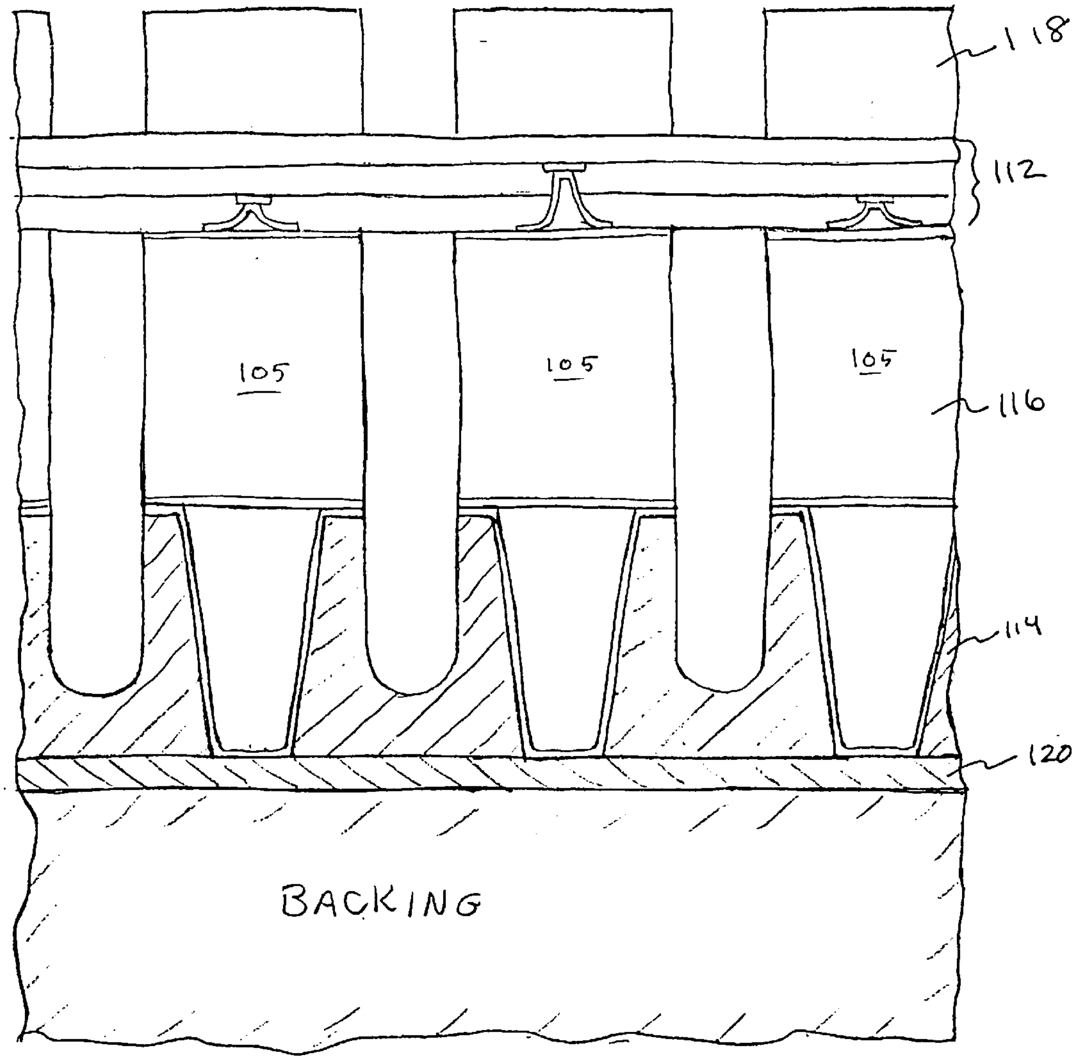

The embodiment shown in FIG. 14 is similar to the embodiment illustrated in FIG. 13, except that the relative positions of the flexible circuit 112 and ground plane 120 are reversed. Thus, in this embodiment, the ground plane 120 is disposed between the interface layer 114 and the backing 110, and the flexible circuit 112 is disposed between the piezoelectric layer 116 and the matching layer 118. In this embodiment, as in the embodiment illustrated in FIG. 9, since the ground plane is to be interconnected to all piezoelectric elements 105, it is not necessary to provide electrically isolated connections through interface layer 114. Also, in the situation where the interface layer 114 is electrically conductive, the interface layer 114 itself can serve as the ground plane. In this embodiment, as in the embodiment illustrated in FIG. 13, the matching layer 118 need not be electrically conductive and may be pre-diced prior to being mounted on the flexible circuit 112.

When the flexible circuit 112 is disposed between matching layer 118 and piezoelectric elements 105, the ground plane 120 should be located below the interface layer 114, so that dicing of the elements does not sever the ground plane 120. When the flexible circuit 112 is disposed above the piezoelectric elements, the flexible circuit 112 should be thin enough to not interfere appreciably with transmission and reception of ultrasound energy.

It should be understood that various changes and modifications of the embodiments shown in the drawings and described in the specification may be made within the spirit and scope of the present invention. For example, although the electrical interconnection between the top surface and bottom surface of the interface layer 114 has been described using vias coated, filled, covered or sputtered with conductive material, alternative structures, may be used. One example of such alternative structure includes an interface layer having a plurality of parallel, isolated wires connected between its top surface and its bottom surface. The interface layer 114 with a plurality of parallel, isolated wires enables the piezoelectric elements on the top surface to communicate with respective traces or pads formed directly below the piezoelectric element, while electrically isolating adjacent elements.

Although the two-dimensional phased array ultrasound transducer disclosed herein includes square elements formed in a square array, the invention is not limited in this regard. Accordingly, in accordance with the teachings of this invention, the array can include transducers with various shapes, such as rectangular, triangular, circular or elliptical transducers. Likewise, the array itself can be fabricated in any desired shape, such as circular, elliptical, triangular, rectangular, etc. Additionally, although the array disclosed herein has elements formed in rows and columns, other patterns of transducer elements within the array may be equally suitable, such as helical, staggered, logarithmic, etc.

Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A two-dimensional ultrasound phased array transducer, comprising:

an acoustically absorptive acoustic backing comprising an acoustic backing material having acoustic characteristics;

a first electrical circuit disposed over the acoustic backing;

an acoustically absorptive interface layer disposed over the electrical circuit, said interface layer comprising a material having acoustic characteristics similar to the acoustic characteristics of the acoustic backing material;

a plurality of individual transducer elements disposed on the interface layer and electrically connected through said interface layer to said electrical circuit; and a second electrical circuit disposed over the transducer elements and electrically connected to the transducer elements.

2. The two-dimensional ultrasound phased array transducer of claim 1, further comprising:

an electrically conductive matching layer disposed over the transducer elements and under the second electrical circuit.

3. The two-dimensional ultrasound phased array transducer of claim 2, wherein the first electrical circuit is a flexible circuit comprising multiple electrical traces and wherein the second electrical circuit is a ground plane.

4. The two-dimensional ultrasound phased array transducer of claim 2, wherein the first electrical circuit is a ground plane and wherein the second electrical circuit is a flexible circuit comprising multiple electrical traces.

5. The two-dimensional ultrasound phased array transducer of claim 1, further comprising a diced matching layer disposed over the second electrical circuit.

6. The two-dimensional ultrasound phased array transducer of claim 5, wherein the first electrical circuit is a flexible circuit comprising multiple electrical traces and wherein the second electrical circuit is a ground plane.

7. The two-dimensional ultrasound phased array transducer of claim 5, wherein the first electrical circuit is a ground plane and wherein the second electrical circuit is a flexible circuit comprising multiple electrical traces.

8. The two-dimensional ultrasound phased array transducer of claim 1, where the individual elements are separated by kerfs formed by dicing a piezoelectric layer to form the transducer elements.

9. The two dimensional ultrasound phased array transducer of claim 8, wherein kerfs between individual elements extend at least partially into the interface layer.

10. The two-dimensional ultrasound phased array transducer of claim 1, wherein the interface layer is formed of the same material as the acoustic backing material.

11. A method of forming an ultrasound array, comprising:

providing a backing layer;

disposing a first electrical circuit over the backing layer;

disposing an acoustically absorptive interface layer over the first electrical circuit;

disposing a piezoelectric layer over the interface layer, a lower surface of said piezoelectric layer being electrically connected to said interface layer by vias formed in the acoustically absorptive interface layer at least partially coated with an electrically conductive substances;

dicing the piezoelectric layer to form kerfs extending through the piezoelectric layer and into the interface layer; and then disposing a second electrical circuit over the piezoelectric layer.

12. A method of forming an ultrasound array, comprising:

providing a backing layer;

disposing a flexible circuit comprising multiple electrical traces over the backing layer;

disposing an acoustically absorptive interface layer over the flexible circuit;

disposing a piezoelectric layer over the interface layer, a lower surface of said piezoelectric layer being electrically connected to said interface layer;

dicing the piezoelectric layer to form kerfs extending through the piezoelectric layer and into the interface layer;

then disposing a ground plane over the piezoelectric layer; and disposing a matching layer over the piezoelectric layer prior to dicing.

13. A method of forming an ultrasound array, comprising:

providing a backing layer;

disposing a ground plane over the backing layer;

disposing an acoustically absorptive interface layer over the ground plane;

disposing a piezoelectric layer over the interface layer, a lower surface of said piezoelectric layer being electrically connected to said interface layer;

dicing the piezoelectric layer to form kerfs extending through the piezoelectric layer and into the interface layer;

then disposing a flexible circuit comprising multiple electrical traces over the piezoelectric layer; and disposing a matching layer over the piezoelectric layer prior to dicing.

14. A method of forming an ultrasound array, comprising:

providing a backing layer;

disposing a flexible circuit comprising multiple electrical traces over the backing layer;

disposing an acoustically absorptive interface layer over the flexible circuit;

disposing a piezoelectric layer over the interface layer, a lower surface of said piezoelectric layer being electrically connected to said interface layer;

dicing the piezoelectric layer to form kerfs extending through the piezoelectric layer and into the interface layer;

then disposing a ground plane over the piezoelectric layer; and disposing a pre-diced matching layer over the ground plane.

15. A method of forming an ultrasound array, comprising:

providing a backing layer;

disposing a ground plane over the backing layer;

disposing an acoustically absorptive interface layer over the ground plane;

disposing a piezoelectric layer over the interface layer, a lower surface of said piezoelectric layer being electrically connected to said interface layer;

dicing the piezoelectric layer to form kerfs extending through the piezoelectric layer and into the interface layer;

then disposing a flexible circuit comprising multiple electrical traces over the piezoelectric layer; and disposing a pre-diced matching layer over the flexible electrical circuit.

* * * * *